(12) United States Patent
Shamoto et al.

(10) Patent No.: US 11,603,601 B2
(45) Date of Patent: Mar. 14, 2023

(54) PLATING DEVICE AND RESISTOR

(71) Applicant: EBARA CORPORATION, Tokyo (JP)

(72) Inventors: Mitsuhiro Shamoto, Tokyo (JP); Shao Hua Chang, Tokyo (JP); Masaki Tomita, Tokyo (JP); Masashi Shimoyama, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 64 days.

(21) Appl. No.: 17/186,007

(22) Filed: Feb. 26, 2021

(65) Prior Publication Data

US 2021/0277533 A1 Sep. 9, 2021

(30) Foreign Application Priority Data

Mar. 4, 2020 (JP) .............................. JP2020-036950

(51) Int. Cl.
*C25D 5/08* (2006.01)
*C25D 7/12* (2006.01)
*H01L 21/288* (2006.01)
*H01L 23/00* (2006.01)

(52) U.S. Cl.
CPC ................. *C25D 7/12* (2013.01); *C25D 5/08* (2013.01); *H01L 21/288* (2013.01); *H01L 24/11* (2013.01)

(58) Field of Classification Search
None
See application file for complete search history.

(56) References Cited

U.S. PATENT DOCUMENTS 6,632,335 B2* 10/2003 Kunisawa ........... H01L 21/6715
257/E21.585
2016/0115611 A1* 4/2016 Mayer ...................... C25D 5/18
205/96

FOREIGN PATENT DOCUMENTS

JP 2001316877 11/2001

* cited by examiner

*Primary Examiner* — Stefanie S Wittenberg
(74) *Attorney, Agent, or Firm* — JCIPRNET

(57) ABSTRACT

A plating device includes: an anode; a substrate holder which holds a substrate; a substrate contact which comes into contact with a peripheral edge portion of the substrate; a resistor which is disposed in a way of facing the substrate holder between the anode and the substrate holder, and is used for adjusting ion movement; and a rotation driving mechanism which causes the resistor and the substrate holder to relatively rotate. The resistor includes: a shielding region which forms an outer frame and shields the ion movement between the anode and the substrate; and a resistance region which is formed on the radially inner side of the shielding region, and has a porous structure allowing the passage of an ion. An outer diameter of the resistance region has an amplitude centering on an imaginary reference circle, and has a wave shape which is periodic and annularly continuous.

8 Claims, 13 Drawing Sheets

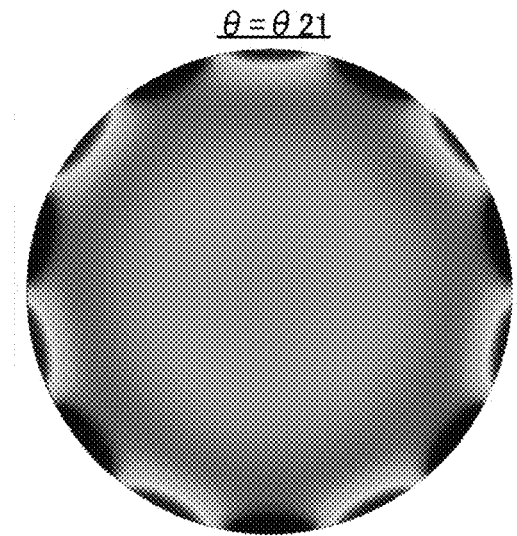 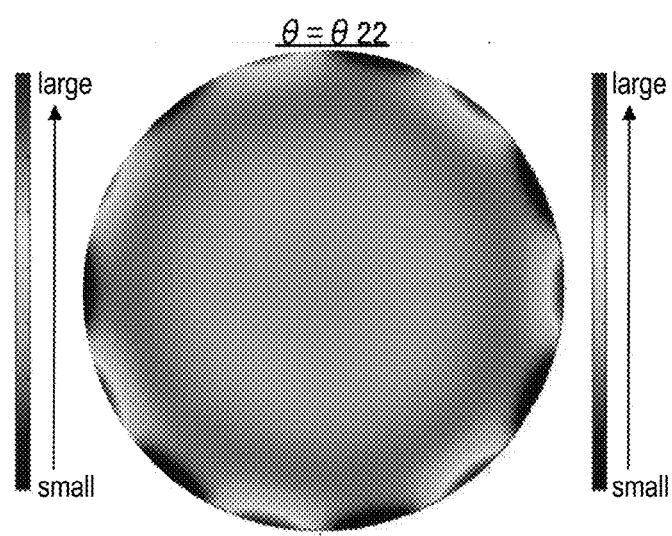
FIG. 9(a)  FIG. 9(b)
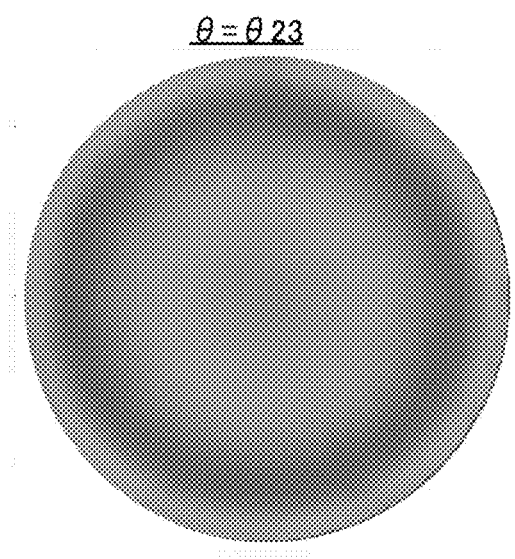 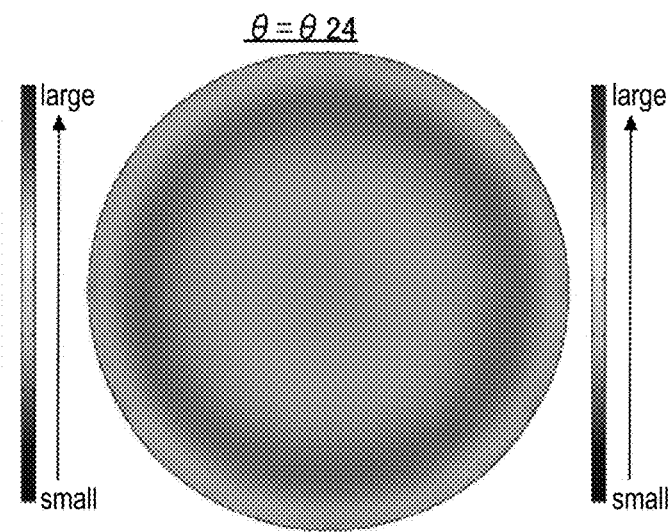
FIG. 9(c)  FIG. 9(d)

PLATING DEVICE AND RESISTOR

CROSS-REFERENCE TO RELATED APPLICATION

This application claims the priority benefit of Japan application serial no. 2020-036950, filed on Mar. 4, 2020. The entirety of the above-mentioned patent application is hereby incorporated by reference herein and made a part of this specification.

BACKGROUND

Technical Field

The disclosure relates to a plating device and a resistor.

Related Art

As a method for forming a wiring or a bump (protruding electrode) on a circular substrate such as a semiconductor wafer or the like, an electrolytic plating method is widely used which is relatively inexpensive and has a short treatment time. A plating device used for the electrolytic plating method includes: a substrate holder which holds a substrate in a state that the substrate is exposed; and an anode which is disposed in a way of facing the substrate. The substrate is connected to a power supply via the substrate holder, and the anode is connected to the power supply via an anode holder which holds the anode. During a plating treatment, each substrate holder is immersed in a plating liquid, and a current or a voltage is applied between the anode and the substrate similarly immersed in the plating liquid, and thereby conductive materials are deposited on a substrate surface.

In general, electrical contacts for making electricity flow to the substrate are disposed along a peripheral edge portion of the substrate. Therefore, a distance to the electrical contacts is different between a center portion of the substrate and the peripheral edge portion of the substrate, and a potential difference is generated between the center portion of the substrate and the peripheral edge portion of the substrate corresponding to an electrical resistance of a seed layer. Therefore, the plating layer becomes thinner in the center portion of the substrate, and the plating layer of the peripheral edge portion of the substrate becomes thicker. In addition, in the peripheral edge portion of the substrate, the potential is different depending on the distance to the electrical contacts, and thus fluctuations in a film thickness distribution of a plating film are generated in a peripheral direction.

Uniformity in the thickness of the plating film on the substrate surface is referred to as "in-plane uniformity". Conventionally, in order to obtain a plating film having high in-plane uniformity, a control of ion movement between the anode and the substrate has been performed. For example, a plating device including an insulator which is referred to as a resistor between the anode and the substrate is disclosed (Japanese Patent Laid-Open No. 2001-316877, Patent literature 1). The resistor has a porous structure, and has a structure in which a plating liquid enters a hole portion of the resistor. An ion in the plating liquid passes through this hole portion and is then adsorbed to the substrate.

When a distance between the resistor and the substrate is small, the ion which has passed through the hole portion easily moves straight toward the substrate, and thus a plating film having excellent in-plane uniformity is obtained on the surface of the substrate. However, the distance between the resistor and the substrate may be increased for the structural reasons of the plating device. In this case, the ion which has passed through the hole portion moves in the plating liquid between the resistor and the substrate, and is easily attracted to the peripheral edge portion of the substrate (the vicinity of the electrical contact). Therefore, there is a possibility that the plating film easily becomes thicker in the peripheral edge portion of the substrate, and the excellent in-plane uniformity cannot be ensured.

The disclosure is to provide a plating device capable of maintaining excellent in-plane uniformity of the plating film regardless of the distance between the resistor and the substrate.

SUMMARY

One aspect of the disclosure is a plating device for performing a plating treatment on a substrate having a circular plating region. This plating device includes: a plating tank; an anode which is disposed in the plating tank; a substrate holder which holds the substrate and is disposed in a way of facing the anode in the plating tank; a substrate contact which comes into contact with a peripheral edge portion of the substrate and supplies a current to the substrate; a resistor which is disposed in a way of facing the substrate holder between the anode and the substrate holder in the plating tank, and is used for adjusting ion movement between the anode and the substrate; and a rotation driving mechanism which causes the resistor and the substrate holder to relatively rotate around an axis line. The resistor includes: a shielding region which forms an outer frame and shields the ion movement between the anode and the substrate; and a resistance region which is formed on the radially inner side of the shielding region, and has a porous structure allowing the passage of an ion. An outer shape of the resistance region has an amplitude centering on an imaginary reference circle, and has a wave shape which is periodic and annularly continuous.

Another aspect of the disclosure is a resistor which is attached to a plating tank of a plating device and is used for adjusting ion movement between an anode and a substrate. This resistor includes: a shielding region which forms an outer frame of the resistor and shields an ion; and a resistance region which is formed on the radially inner side of the shielding region, and has a porous structure allowing the passage of the ion. An outer shape of the resistance region has an amplitude centering on an imaginary reference circle, and has a wave shape which is periodic and annularly continuous.

BRIEF DESCRIPTION OF THE DRAWINGS

FIG. 9(a) to FIG. 9(d) are diagrams representing a difference in the film thickness distribution when the rotation angle is differentiated.

DESCRIPTION OF THE EMBODIMENTS

Hereinafter, the embodiment is described with reference to the drawings. Besides, in the following embodiment and variation examples thereof, approximately the same constituent elements are marked with the same signs, and repeated descriptions are appropriately omitted.

Figure 1:
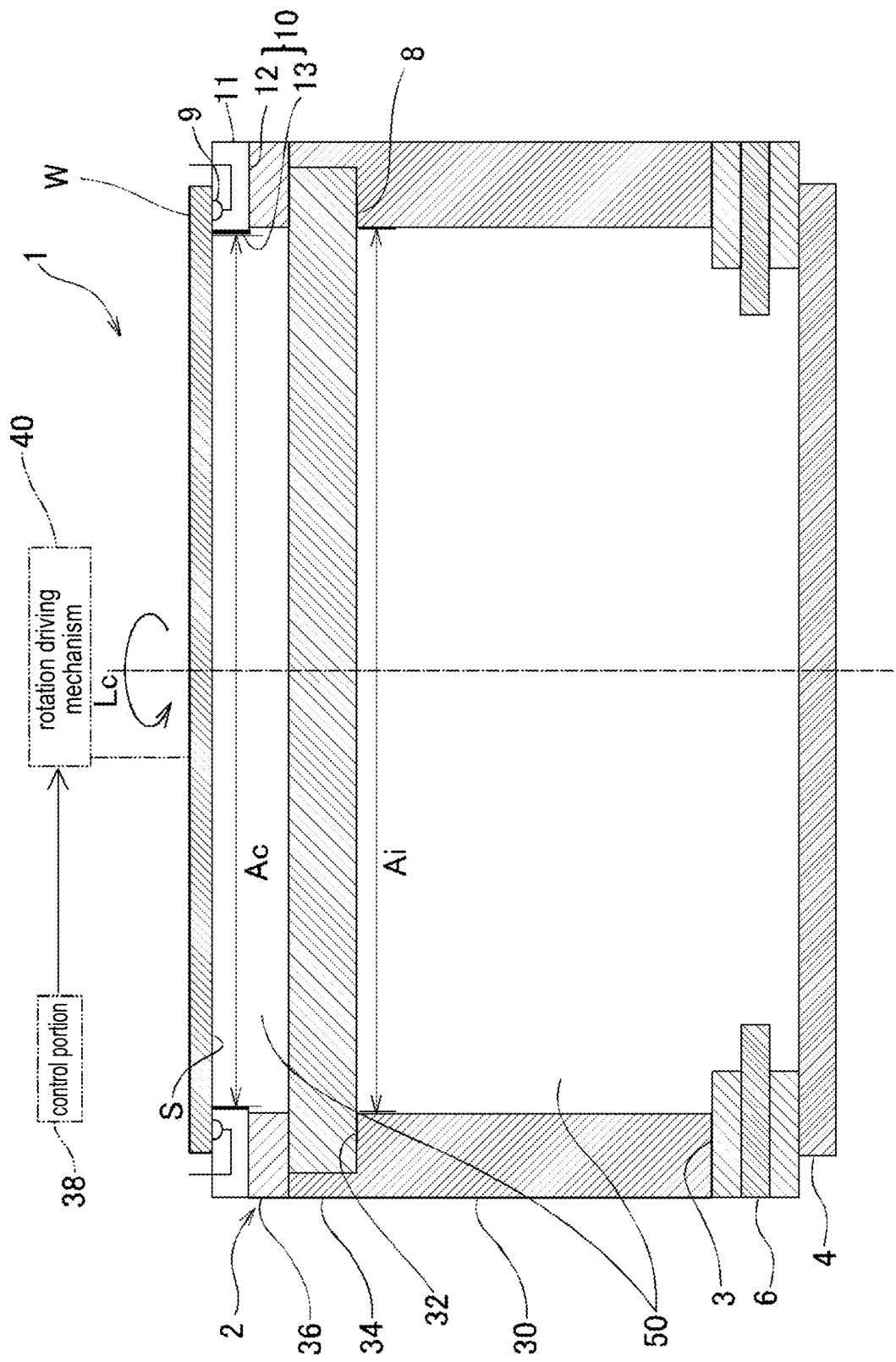
FIG. 1 is a diagram schematically showing a configuration of a plating device.

FIG. 1 is a cross-sectional view schematically showing a configuration of a plating device 1.

The plating device 1 includes a plating tank 2 and a disc-shaped resistor 8. The whole plating tank 2 or a part of the plating tank 2 includes a cylindrical wall portion 30. The plating tank 2 is filled with a plating liquid 50. In a lower end portion of the wall portion 30, an anode holder 3 is disposed. The anode holder 3 holds an anode 4 and an anode mask 6. The anode 4 is arranged in a lower portion of the anode holder 3, and is connected to an external power supply via a wiring not shown. The anode mask 6 is arranged in a position away from the anode 4. The anode mask 6 is included in a form of covering a peripheral edge portion on an upper surface of the anode 4. The anode holder 3, the anode 4, and the anode mask 6 which are known can be applied, and thus descriptions are omitted.

In an upper end portion of the wall portion 30, a substrate holder 11 is disposed. The substrate holder 11 holds a circular substrate W. In the embodiment, plating is applied to one side of the substrate W. Hereinafter, in two surfaces of the substrate W, a surface to which the plating is applied is referred to as a "plating surface S". In a form in which the plating surface S is directed downward in a way of facing the anode 4, the substrate holder 11 is arranged in the plating tank 2.

The substrate holder 11 includes a holding portion 10 and substrate contacts 9. The holding portion 10 has a frame-like holding member 12 and an annular sealing portion 13. The sealing portion 13 is arranged along an inner peripheral edge of the holding member 12. The holding member 12 holds the substrate W in a form of going along a peripheral edge portion of the substrate W. The substrate contacts 9 are arrayed along a peripheral edge portion of the plating surface S, and intervals between the adjacent substrate contacts 9 are equal. The substrate contacts 9 abut against the peripheral edge portion of the plating surface S of the substrate W, and apply a potential to the substrate W. The sealing portion 13 abuts against the plating surface S of the substrate W closer to the inner side than the substrate contacts 9. The substrate contacts 9 are arranged between the substrate W and the holding portion 10. According to this structure, the substrate contacts 9 are isolated from the plating liquid 50.

A region of the plating surface S closer to the radially inner side than an abutting position of the sealing portion 13 is immersed in the plating liquid 50, and becomes an object to be plated. Hereinafter, this region is referred to as a "plating region Ac". The plating region Ac has a perfect circular shape which is concentric to the plating surface S.

The resistor 8 is arranged away from the anode mask 6 above the anode mask 6. The resistor 8 restricts ion movement between the anode 4 and the substrate W. A peripheral edge portion of the resistor 8 is fixed to the wall portion 30. That is, the wall portion 30 has a tubular lower wall portion 34 and an annular upper wall portion 36. In an upper opening portion of the lower wall portion 34, a step portion 32 is arranged. The resistor 8 is sandwiched between the lower wall portion 34 and the upper wall portion 36 in a form in which the peripheral edge portion of the resistor 8 is fitted to the step portion 32. A region of the resistor 8 closer to the radially inner side than an abutting position with the wall portion 30 is immersed in the plating liquid 50. Hereinafter, a contact region in the resistor 8 which comes into contact with the plating liquid 50 is referred to as a "wetted region Ai". Details of a structure of the resistor 8 are described later.

In the embodiment, the substrate holder 11 is rotated by a rotation driving mechanism 40. A control portion 38 controls a rotation of the rotation driving mechanism 40. An axis line of the substrate W and an axis line of the resistor 8 are coincident. Hereinafter, this axis line is referred to as an axis line Lc. The substrate holder 11 rotates around the axis line Lc. That is, the substrate W rotates around the axis line Lc. Meanwhile, the resistor 8 does not rotate, and the position of the resistor 8 is fixed with respect to the plating tank 2. The substrate W and the resistor 8 relatively rotate around the axis line Lc.

Figure 2A:
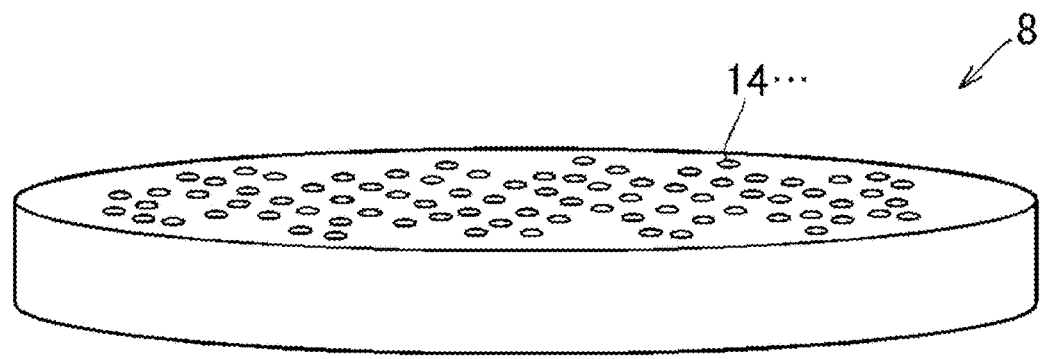
FIG. 2(a) to FIG. 2(c) are diagrams showing an overview of a resistor.
Figure 2B:
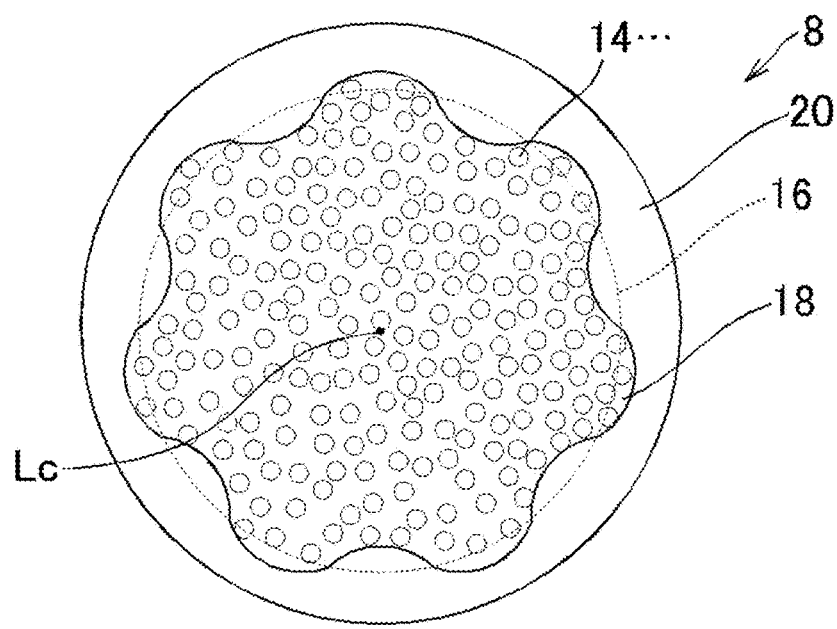
Figure 2C:
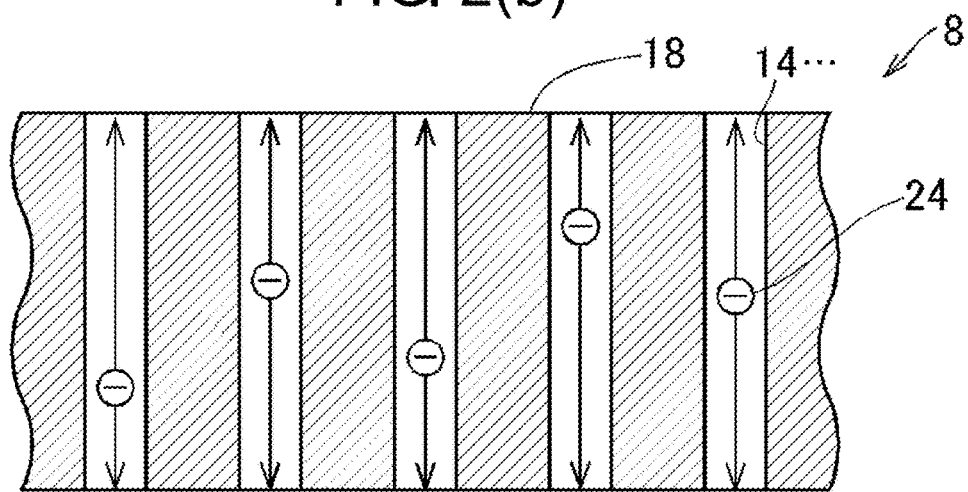

FIG. 2(a) to FIG. 2(c) are diagrams showing an overview of the resistor 8. FIG. 2(a) shows a perspective view, and FIG. 2(b) shows a plane view. FIG. 2(c) is a partial cross-sectional view showing a behavior of an ion 24 in the resistor 8. In FIG. 2(c), an arrow shows a movement direction of the ion 24.

As shown in FIG. 2(a), the resistor 8 has a structure in which a plurality of holes 14 are arranged on a disc-shaped insulator. In the embodiment, a punching plate is used as the resistor 8. Besides, for convenience of explanation, the size of the hole 14 is shown more emphatically than actual.

As shown in FIG. 2(b), a region (resistance region 18) in which the hole 14 is arranged and a shielding region 20 in which no hole 14 is arranged exist on the resistor 8. The shielding region 20 forms an outer frame of the resistor 8. In the shielding region 20, the resistor 8 shields the movement of the ion 24 between the anode 4 and the substrate W (see FIG. 1). The resistance region 18 is formed closer to the radially inner side than the shielding region 20 in the resistor 8. The resistance region 18 has a porous structure in which a plurality of holes 14 penetrating in a thickness direction are arranged. The resistance region 18 can also be referred to as an internal region of an envelope surrounding a plurality of holes 14 which are farthest from a center of the resistor 8 from an outer side.

An outer shape of the resistance region 18 has a wave shape. More specifically, the outer shape is a shape having an amplitude centering on an imaginary reference circle 16. A center of the reference circle 16 is positioned on the axis line Lc of the resistor 8. In the embodiment, this outer shape has an epitrochoidal shape shown by formula 1 described below.

Function $f(x,y)$ ($0$ [deg]$\leq q \leq 360$ [deg])   [formula 1], wherein $x = \text{Rstd} * \sin q * (1+(a/\text{Rstd})*\cos(q*v))$ and $y = \text{Rstd} * \cos q * (1+(a/\text{Rstd})*\cos(q*v))$.

Here, reference characters x and y denote positions on a plane orthogonal to the axis line Lc. Reference character Rstd denotes a radius of the reference circle 16, reference character a denotes an amplitude of an epitrochoid with respect to the reference circle 16, and reference character q denotes a rotation angle of a rolling circle drawing the epitrochoid. In addition, reference character v denotes the number of apexes of the epitrochoid with respect to the reference circle 16. In the embodiment, the outer shape of the resistance region 18 is an epitrochoid having the number of apexes v=14. Details of the number of apexes v of the resistance region 18 are described later.

As shown in FIG. 2(c), the hole 14 penetrates the resistor 8 in the thickness direction of the resistor 8. A diameter of the hole 14 has a size allowing the ion 24 to pass through. The ion 24 can pass through the hole 14 of the resistance region 18, and thereby move from the side of the anode 4 to the side of the substrate W, and move from the side of the substrate W to the side of the anode 4 (see FIG. 1). That is, the hole 14 functions as an "ion conduction path".

Figure 3:
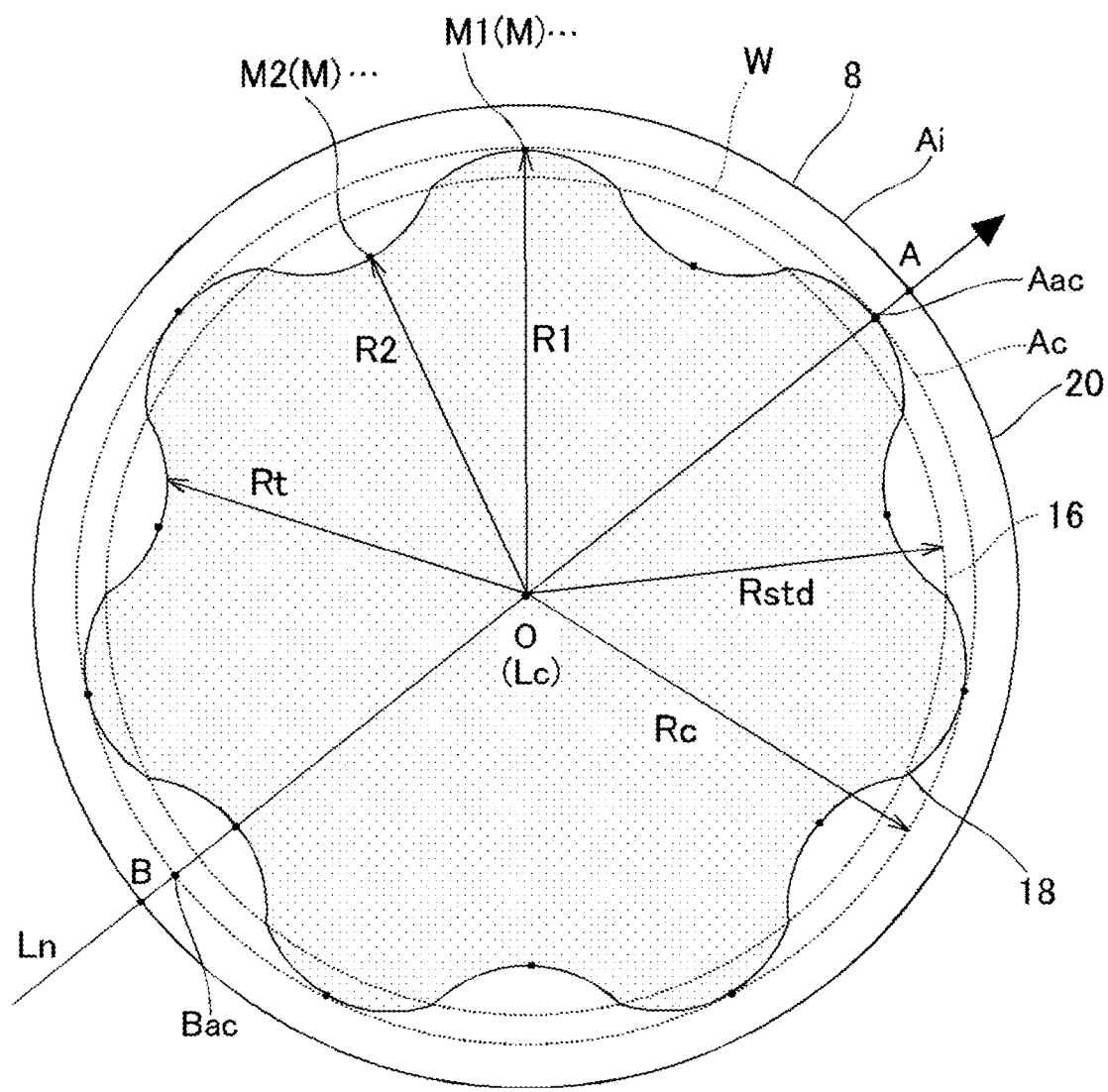
FIG. 3 is a conceptual diagram showing a positional relationship between the resistor and a substrate.

FIG. 3 is a conceptual diagram showing a positional relationship between the resistor 8 and the substrate W. In FIG. 3, the shape related to the resistor 8 is shown by a solid line, and the shape related to the substrate W is shown by a dotted line.

As described in relation to FIG. 1, the axis line of the substrate W and the axis line of the resistor 8 are coincident as the axis line Lc. That is, the axis line Lc passes through both of a center of the substrate W and a center of the resistor 8. In FIG. 3, the center of the resistor 8 (the center of the resistance region 18) is shown as a "center O".

The outer shape of the resistance region 18 has an epitrochoidal shape. The outer shape of the resistance region 18 has a plurality of apexes M1 from which distances to the center O are the largest, and a plurality of apexes M2 from which distances to the center O are the smallest. The apexes M1 are positioned on the outer side of the reference circle 16, and the apexes M2 are positioned on the inner side of the reference circle 16. Hereinafter, the apexes M1 and the apexes M2 are referred to as "apexes M" when not specially distinguished. The number of the apexes M1 and the number of the apexes M2 are 7 each. In other words, the number of the apexes M (the number of apexes v in formula 1) is 14.

The radius Rstd of the reference circle 16 is set to be smaller than a radius Rc of the plating region Ac. Thus, a radius R2 of an inscribed circle of seven apexes M2 is smaller than the radius Rc. Meanwhile, in the embodiment, a radius R1 of a circumscribed circle of seven apexes M1 is set to be equal to the radius Rc. A size relationship between an outermost diameter of the resistance region 18 and an outer diameter of the plating region Ac is not limited hereto, and the outermost diameter of the resistance region 18 may be smaller than the outer diameter of the plating region Ac. Hereinafter, a distance between the peripheral edge and the center O of the resistance region 18 (a radius of the epitrochoid) may be referred to as a "radius Rt".

The outer shape of the resistance region 18 is an annularly continuous shape. That is, the outer shape of the resistance region 18 is annularly connected over the entire periphery. Besides, for convenience prior to descriptions below, a straight line passing through a specific point on the peripheral edge and the center O of the resistance region 18 is defined as a "straight line Ln". Here, the straight line Ln is set in a way that when one of two intersection points of the straight line Ln and the peripheral edge of the resistance region 18 is the apex M1, the other intersection point is the apex M2. In addition, two intersection points of the peripheral edge of the wetted region Ai and the straight line Ln are respectively set as a point A and a point B. Furthermore, in two intersection points of the peripheral edge of the plating region Ac (exactly, a projection of the peripheral edge in an axis line direction) and the straight line Ln, one intersection point close to the point A is set as a point Aac, and the other intersection point close to the point B is set as a point Bac.

Hereinafter, analysis results representing the influences of the structure and the arrangement of a resistor on the in-plane uniformity of a plating film are described. Besides, when FIGS. 4 to 12 are described as below, a positional relationship between the resistor 8 and the substrate W and the like are described based on FIGS. 1 to 3.

Figure 4A:
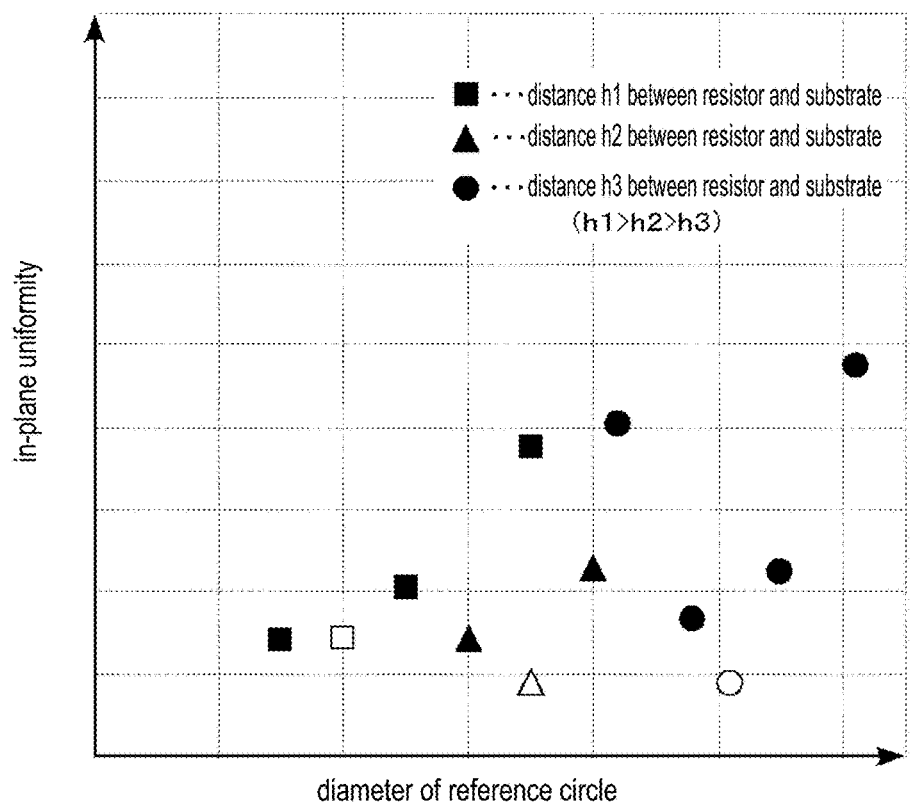
FIG. 4(a) to FIG. 4(b) are graphs showing the influence of a shape of a resistance region on in-plane uniformity.
Figure 4B:
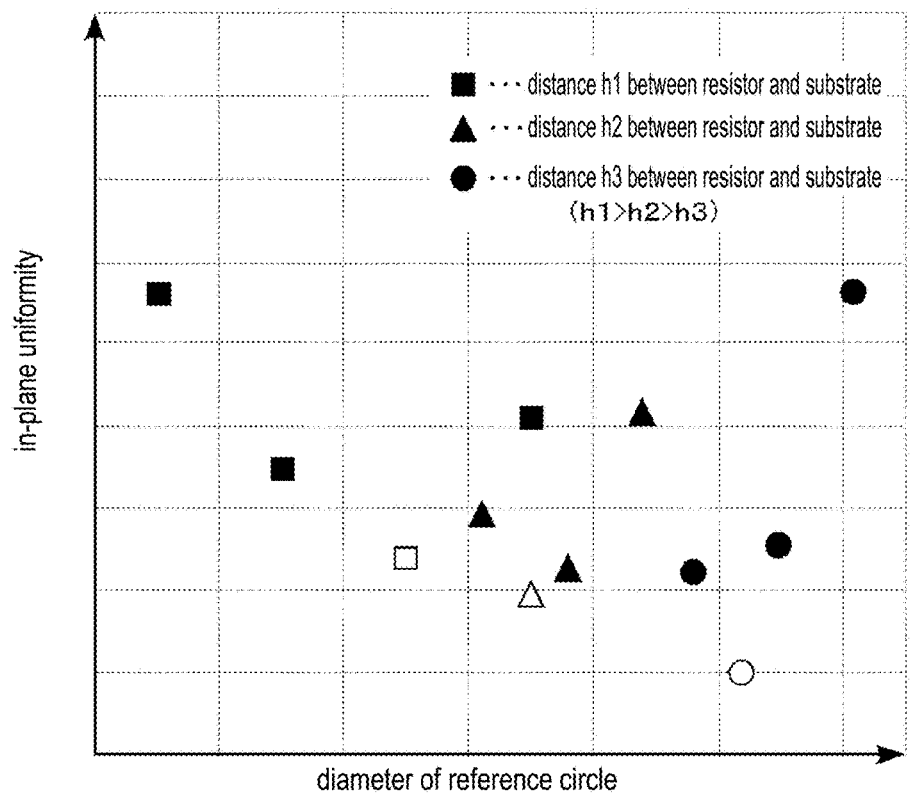

FIG. 4(a) to FIG. 4(b) are graphs showing the influence of a shape of a resistance region on the in-plane uniformity. Specifically, the influence when a distance between the resistor and the substrate W is changed is shown. FIG. 4(a) shows a case in which the resistor 8 is used as the embodiment. FIG. 4(b) shows a case in which a resistor is used as comparative example 1, wherein a resistance region of the resistor has a perfect circular shape with the same diameter as the plating region Ac. A horizontal axis of each graph represents a diameter of a reference circle, and a vertical axis of each graph represents the in-plane uniformity. Scales of the horizontal axis and the vertical axis are common in FIGS. 4(a) and 4(b). FIGS. 4(a) and 4(b) respectively show analysis results when the distances between the resistor and the substrate W are h1, h2, and h3 (h1>h2>h3). Besides, it is shown that the smaller the value of the in-plane uniformity, the more uniform the thickness of the plating film.

In either of the embodiment and comparative example 1, a size of the reference circle 16 having the best in-plane uniformity exists according to the distance between the resistor and the substrate. Hereinafter, the reference circle 16 having the best in-plane uniformity is referred to as an "optimum reference circle". In either of FIGS. 4(a) and 4(b), a case in which the reference circle 16 is the optimum reference circle for each distance is shown by a void mark.

With regard to the optimum reference circle, as shown in FIG. 4(a), excellent in-plane uniformity is maintained regardless of the distance between the resistor 8 and the substrate W in the embodiment. Meanwhile, as shown in FIG. 4(b), in comparative example 1, the in-plane uniformity is reduced when the distance between the resistor and the substrate W becomes large. In other words, in the embodiment, even if the distance between the resistor and the substrate W is increased, the excellent in-plane uniformity can be maintained. This principle is described based on FIGS. 1 to 3.

As described above, in the resistor 8 in the embodiment, the resistance region 18 having an epitrochoidal outer shape is arranged on the radially inner side of the shielding region 20. The ion 24 in the plating liquid 50 passes through the hole 14 arranged in the resistance region 18, and moves between the anode 4 and the substrate W. The ion 24 which has passed through the hole 14 moves to the substrate W from the resistor 8, and is adsorbed to the plating region Ac.

In the embodiment, the radius R1 of the circumscribed circle of the apexes M1 is set to be equal to the radius Re of the plating region Ac. In addition, the resistor 8 and the substrate W relatively rotate. That is, the resistance region 18 and the shielding region 20 alternately face various places of the peripheral edge portion of the plating region Ac along with the rotation of the substrate W. In the resistance region 18, the ion 24 can move from the anode 4 to the substrate W through the hole 14. Meanwhile, in the shielding region 20, the ion 24 cannot move from the anode 4 to the substrate W. According to this structure, when the resistor 8 is used as the embodiment, an increase in the film thickness in the peripheral edge portion of the plating region Ac can be suppressed compared with a case in which the resistor of comparative example 1 is used.

In summary, the outer shape of the resistance region 18 is formed in an epitrochoidal shape, and the resistor 8 and the substrate W are relatively rotated, and thereby the increase in the film thickness in the peripheral edge portion of the plating region Ac can be suppressed. Accordingly, a film thickness difference between the center portion and the peripheral edge portion of the plating region Ac can be suppressed, and thus the in-plane uniformity of the plating film in the substrate W is improved.

Figure 5A:
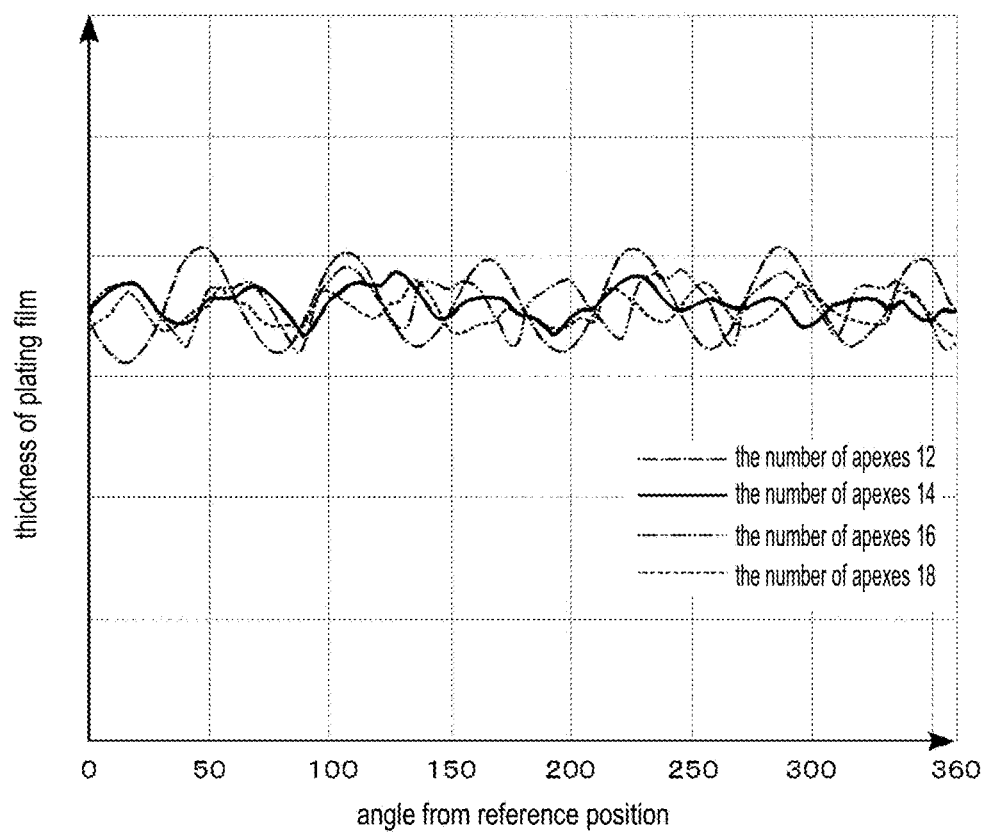
FIG. 5(a) to FIG. 5(b) are graphs showing a relationship between the number of apexes of an outer shape of the resistance region and the thickness of a plating film.
Figure 5B:
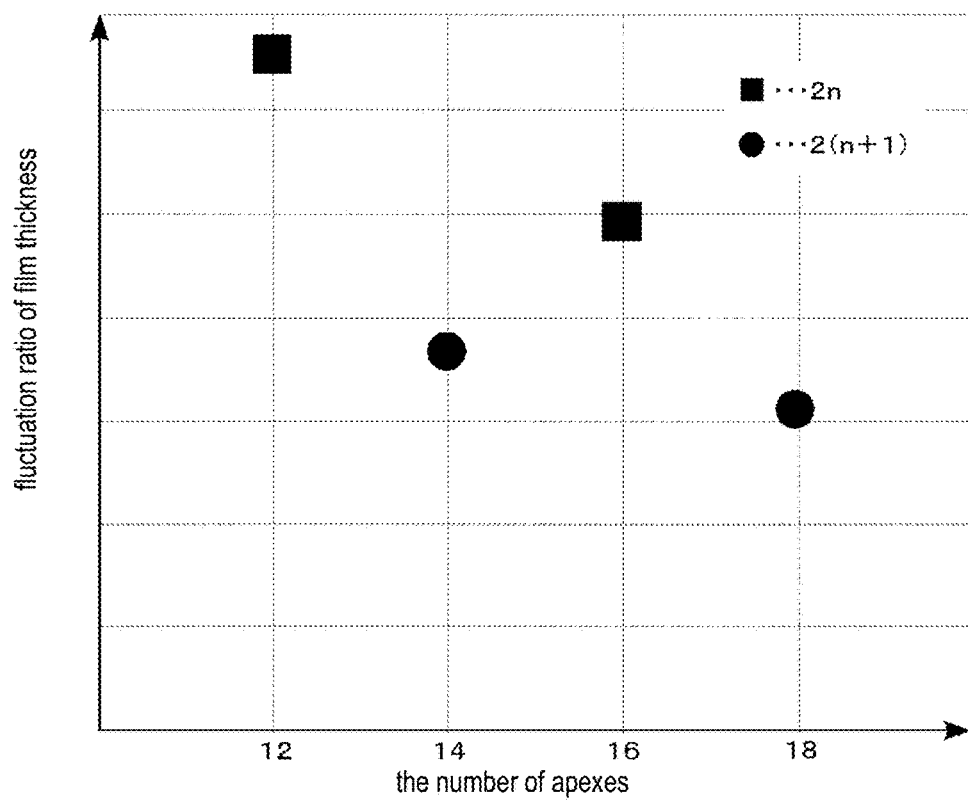

FIG. 5(a) to FIG. 5(b) are graphs showing a relationship between the number of apexes v (see formula 1) of the outer shape of the resistance region 18 and the thickness of the plating film. FIG. 5(a) shows changes of the film thickness (the thickness of the plating film) in a peripheral direction in the vicinity of the outer periphery of the plating region Ac, and FIG. 5(b) shows a fluctuation degree of the film thickness according to the number of apexes v. The "fluctuation degree" mentioned here is shown by a value which is obtained by dividing a difference between a maximum value and a minimum value of the film thickness along the peripheral direction by the maximum value. In FIG. 5(a), a dashed line shows a case in which the number of apexes v is 12, a solid line shows a case in which the number of apexes v is 14, a chain double-dashed line shows a case in which the number of apexes v is 16, and a dotted line shows a case in which the number of apexes v is 18.

As shown in FIG. 5(a), when the number of apexes v is 14 or 18, the fluctuation of the thickness of the plating film is relatively small. At this time, as shown in FIG. 3, when one of the two intersection points of the straight line Ln and the peripheral edge portion of the resistance region 18 is the apex M1, the other intersection point is the apex M2. Meanwhile, when the number of apexes v is 12 or 16, the fluctuation of the thickness of the plating film is relatively large. That is, as shown in FIG. 5(b), when the number of apexes v is 2(2n+1) (n is a natural number), the fluctuation of the thickness of the plating film (the fluctuation ratio of the film thickness) is small. In other words, when the number of apexes v is 2(2n+1), the uniformity of the thickness of the plating film is improved not only in the peripheral edge portion of the plating region Ac but also over the whole region in the peripheral direction. This principle is described based on FIGS. 1 to 3.

When the outer shape of the resistance region 18 is an epitrochoidal shape in which the number of apexes v (see formula 1) is 2(2n+1), if one of the two intersection points of the straight line Ln and the peripheral edge portion of the resistance region 18 is the apex M1, the other intersection point is the apex M2. When the number of apexes v meets this condition, a width (radial length) of the resistance region 18 passing through the center O is constant over the entire periphery. The outer shape of the resistance region 18 is set in this way, and thereby when the resistor 8 and the substrate W are relatively rotated, a bias of the film thickness change in the peripheral direction in the peripheral edge portion of the plating region Ac can be reduced. Thus, in the peripheral edge portion of the plating region Ac, a plating film which has a uniform film thickness in the peripheral direction is formed.

When analysis results of FIG. 4(a) to FIG. 4(b) and FIG. 5(a) to FIG. 5(b) are combined, it is known that the outer shape of the resistance region 18 is set as an epitrochoidal shape in which the number of apexes v of the resistance region 18 is 2(2n+1), and the resistor 8 and the substrate W are relatively rotated, and thereby effects described below are achieved. That is, the thickness of the plating film can be suppressed in the peripheral edge portion of the plating region Ac, and the film thickness can be uniform in the peripheral direction in this peripheral edge portion. Thereby, a plating film having high in-plane uniformity is obtained over the whole region of the plating region Ac.

Besides, there is a possibility that a resistor which includes a resistance region having a perfect circular outer shape is set to be eccentric and is relatively rotated with respect to the substrate W, and thereby a plating film which is uniform in the peripheral direction is also obtained in the vicinity of the outer periphery of the plating region Ac in the same manner as the resistor 8 of the embodiment. However, in this case, there is a risk that a mechanism or the like for making the resistor eccentric with respect to the substrate W is required, and a structure of the plating device is complicated. In addition, it is necessary to make the resistor eccentric with respect to the substrate W and keep a constant distance to the substrate W, and thus the position and the inclination of the resistor need to be strictly managed. The resistor 8 of the embodiment may rotate concentrically with the substrate W, and thus this complicated structure or this strict position management is not required. According to the embodiment, the outer shape of the resistance region 18 is set as a wave shape which is periodic and annularly continuous, and thereby the plating film having excellent in-plane uniformity is easily obtained.

Next, the influence of a degree of the relative rotation between the substrate W and the resistor 8 on the in-plane uniformity of the plating film is described.

FIG. 6(a) to FIG. 6(c) and FIG. 7(a) to FIG. 7(b) are diagrams representing influences on the in-plane uniformity when a speed of the relative rotation between the substrate W and the resistor 8 is kept constant, and a rotation time thereof is differentiated. Besides, for convenience in the analysis, the substrate W is fixed, and the resistor 8 is rotated counter clockwise with respect to the substrate W. The resistor 8 is rotated from a state shown in FIG. 3, that is, a state in which the specific apexes M1 (denoted as "M1a") and M2 (denoted as "M2b") of the resistance region 18 are on the straight line Ln.

Figure 6A:
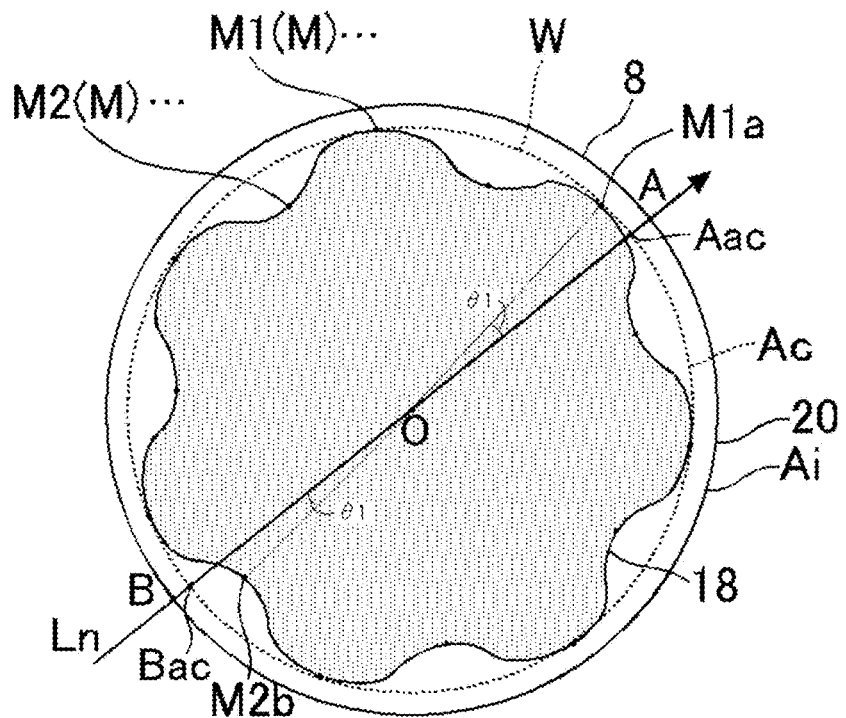
FIG. 6(a) to FIG. 6(c) are diagrams showing a rotation process of the resistor.
Figure 6B:
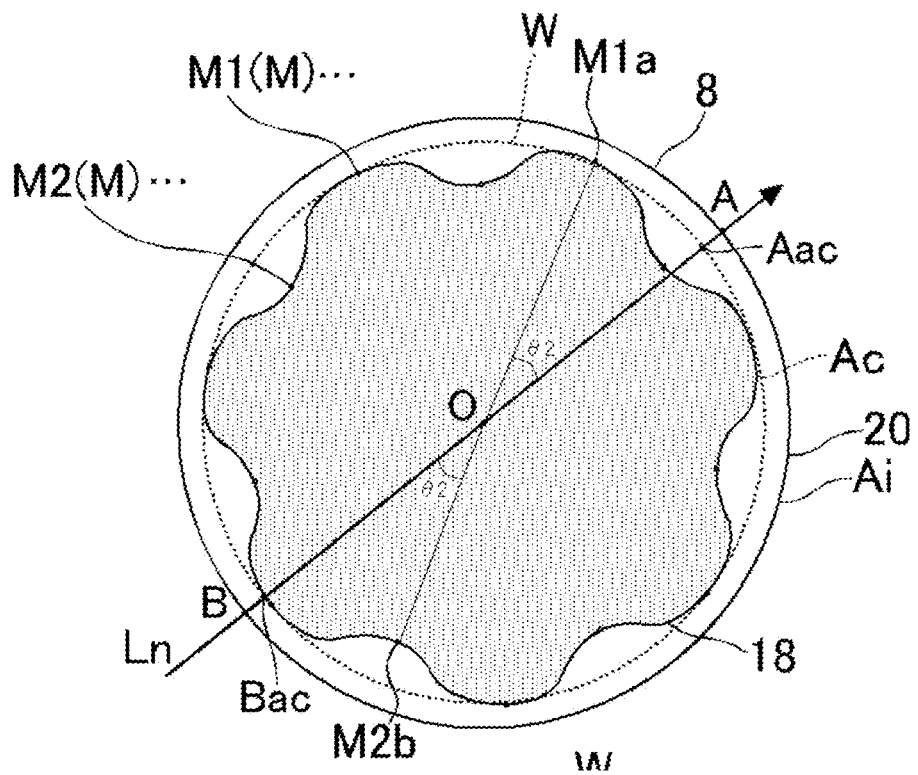
Figure 6C:
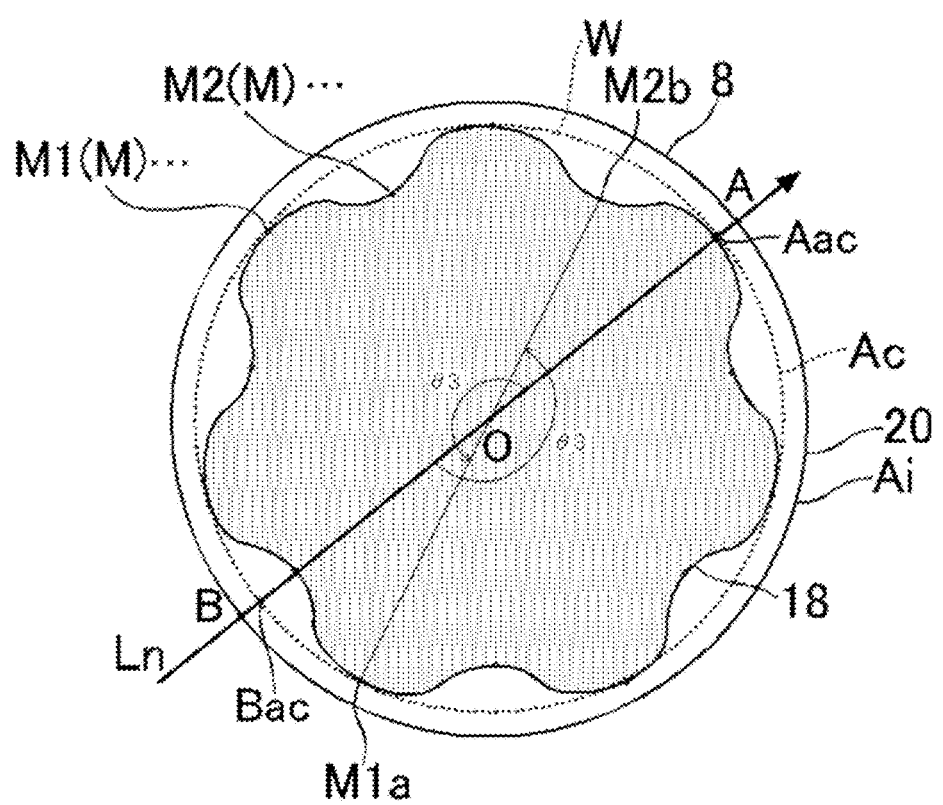

FIG. 6(a) to FIG. 6(c) show a rotation process of the resistor 8. FIG. 6(a) shows a case in which the plating time (equal to the "rotation time") is t1, FIG. 6(b) shows a case in which the plating time is t2, and FIG. 6(c) shows a case in which the plating time is t3 (t1<t2<t3). Along with the rotation of the resistor 8, an epitrochoid curve of the outer shape of the resistance region 18 passes over the straight line Ln. Time t1 is a time corresponding to an angle θ1 at which the rotation angle does not exceed ¼ period of the epitrochoid curve. Time t2 is a time corresponding to an angle θ2 at which the rotation angle is approximately ½ period of the epitrochoid curve. Time t3 is a time corresponding to an angle θ3 (θ3>180°) at which the rotation angle is approximately 4 periods of the epitrochoid curve.

Figure 7A:
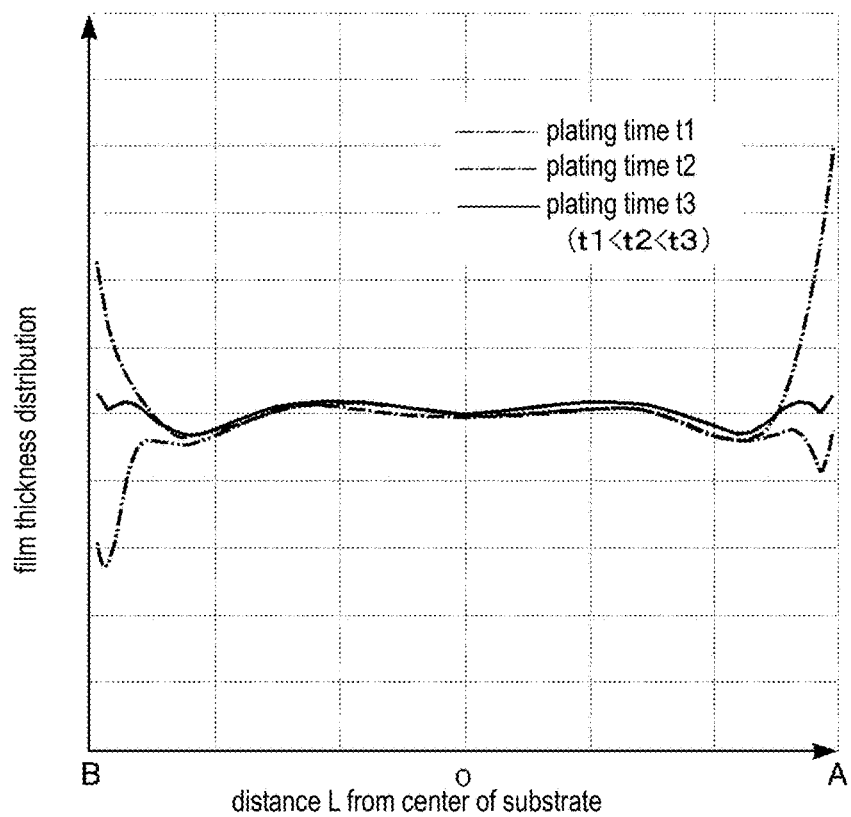
FIG. 7(a) to FIG. 7(b) are graphs showing a film thickness distribution corresponding to a plating time.
Figure 7B:
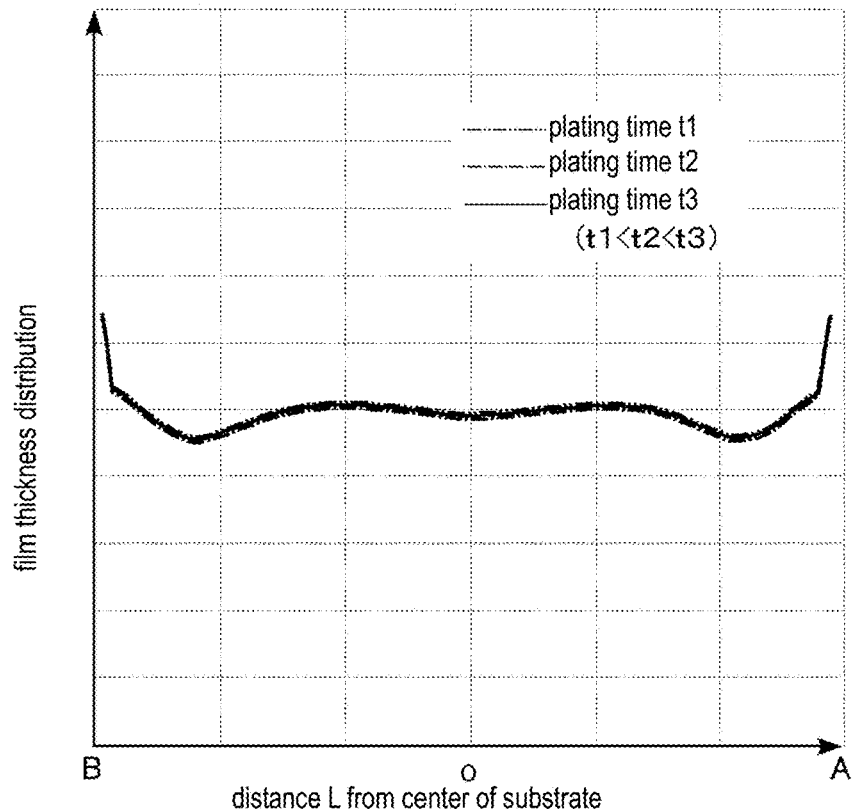

FIG. 7(a) to FIG. 7(b) are graphs showing the film thickness distribution corresponding to each plating time in FIG. 6(a) to FIG. 6(c). FIG. 7(a) shows a case in which the resistor 8 is used as the embodiment. FIG. 7(*b*) shows a case in which a resistor is used as comparative example 2, wherein a resistance region of the resistor has a perfect circular shape with the same diameter as the plating region Ac. In FIGS. 7(*a*) and 7(*b*), a chain double-dashed line shows a case of the plating time t1, a dashed line shows a case of the plating time t2, and a solid line shows a case of the plating time t3.

Besides, the film thickness distribution of the plating film is shown by a value which is obtained by dividing a film thickness in a position thereof by an average film thickness. The plating times t1 to t3 correspond to the times t1 to t3 described in relation to FIG. 6(*a*) to FIG. 6(*c*). The plating time t1 is 5% of the plating time t3 (t1=0.05*t3), and the plating time t2 is 15% of the plating time t3 (t2=0.15*t3).

As shown in FIG. 7(*a*), when the resistor 8 of the embodiment is used, the fluctuation of the film thickness of the plating film from the point B to the point A becomes smaller as the plating time becomes longer. More specifically, at the plating time t1, the thickness of the plating film in the vicinity of the point A is large, and the thickness of the plating film in the vicinity of the point B is small. On the contrary, at the plating time t2, the thickness of the plating film in the vicinity of the point B is large, and the thickness of the plating film in the vicinity of the point A is small. This is attributed to a difference in the position of the shielding region 20 with respect to the peripheral edge portion of the substrate W between a case of the plating time t1 and a case of the plating time t2. At the plating time t3, the plating film having high uniformity from the point B to the point A is obtained.

That is, as shown in FIG. 6(*a*), until the plating time t1, the point A is positioned in the resistance region 18 or close to the resistance region 18. Therefore, in the vicinity of the point A, the ion 24 which has passed through the resistance region 18 is easily adsorbed. Meanwhile, the point B is positioned in the shielding region 20, and thus the ion 24 which has passed through the resistance region 18 is hardly adsorbed. Accordingly, as shown in FIG. 7(*a*), at the plating time t1, the thickness of the plating film in the vicinity of the point A is large, and the thickness of the plating film in the vicinity of the point B is small.

Meanwhile, as shown in FIG. 6(*b*), in the plating times t1 to t2, the vicinity of the point A is gradually covered by the shielding region 20, and the vicinity of the point B is gradually opened to the resistance region 18. Therefore, the ion 24 is hardly adsorbed in the vicinity of the point A because of the influence of the shielding region 20, and the ion 24 is easily adsorbed in the vicinity of the point B because of the influence of the resistance region 18. Accordingly, as shown in FIG. 7(*a*), the thickness of the plating film in the vicinity of the point B is large, and the thickness of the plating film in the vicinity of the point A is small. Nevertheless, in each of the vicinity of the point A and the vicinity of the point B, due to both of the influence of the resistance region 18 and the influence of the shielding region 20, the fluctuation of the film thickness is smoothened. Therefore, the fluctuation of the film thickness at the plating time t2 is smaller than the fluctuation of the film thickness at the plating time t1.

As shown in FIG. 6(*c*), until the plating time t3 elapses, the influence of the resistance region 18 and the influence of the shielding region 20 alternately appear in each of the vicinity of the point A and the vicinity of the point B. Therefore, the fluctuation of the film thickness is further smoothened as the plating time elapses. Accordingly, as shown in FIG. 7(*a*), the plating film having high uniformity is obtained. Besides, at the plating time t3, the thickness of the plating film becomes sufficiently large, and the fluctuation of the film thickness becomes unnoticeable (ignorable) over the whole region of the plating region Ac.

Meanwhile, as shown in FIG. 7(*b*), when the resistor of comparative example 2 is used, the film thickness distribution will not change even if the plating time is increased. The resistance region of the resistor of comparative example 2 has a perfect circular shape. That is, different from the resistor 8 of the embodiment, the resistance region of the resistor of comparative example 2 always faces the peripheral edge portion of the plating region Ac. Thus, even if the plating time is increased, the film thickness of the peripheral edge portion of the plating region Ac will become large, and the influence on the in-plane uniformity cannot be ignored. That is, in the resistor of comparative example 2, the in-plane uniformity of the plating film is not improved. In other words, when the resistor of the embodiment is used and the plating time (the rotation time of the resistor) is ensured to be equal to or more than a predetermined time, the in-plane uniformity when the plating is completed is excellent compared with a case in which the resistor of comparative example 2 is used.

Figure 8:
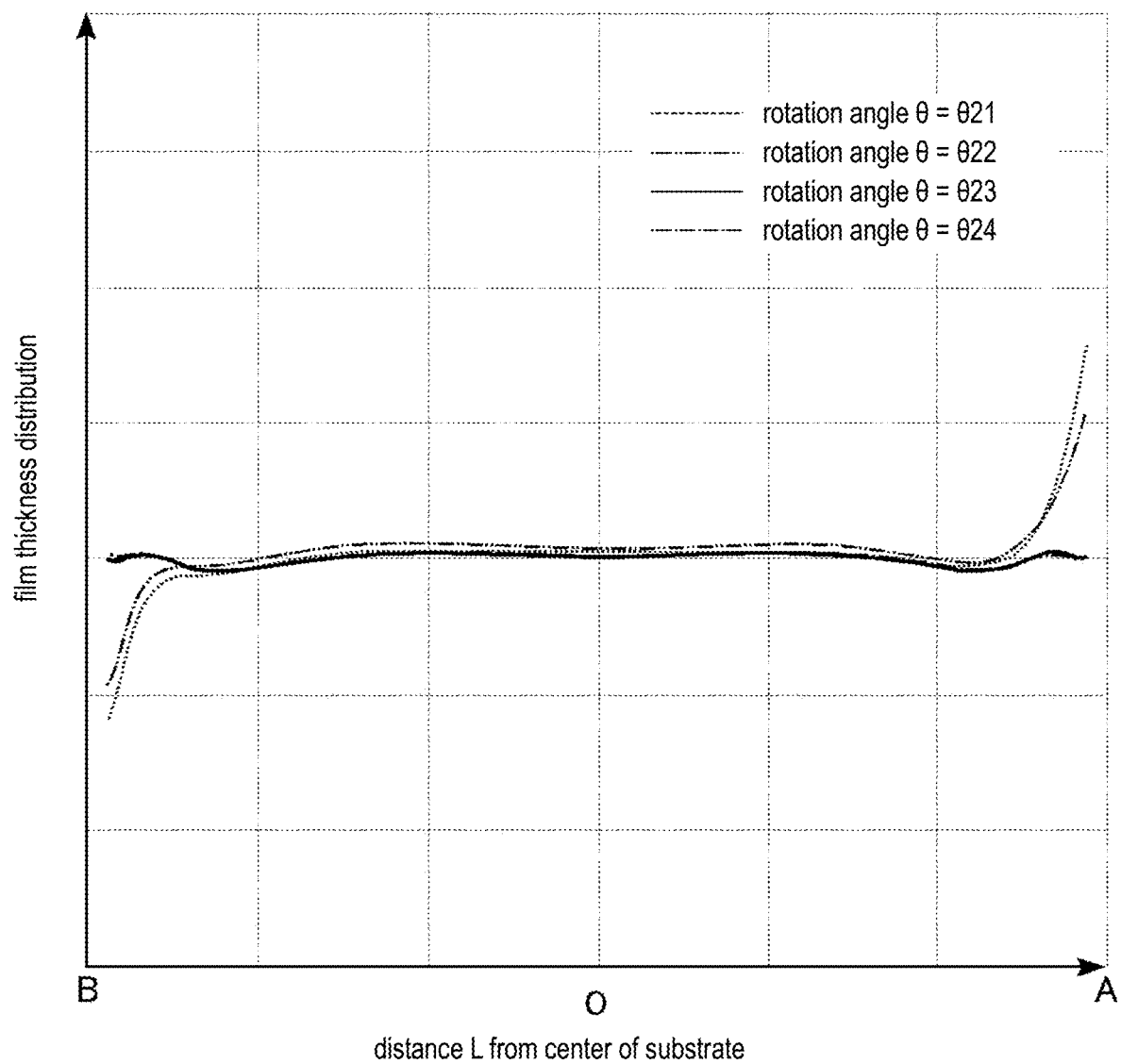
FIG. 8 is a graph showing a difference in the film thickness distribution due to a rotation angle of the substrate.

FIG. 8 is a diagram showing a difference in the film thickness distribution due to a rotation angle θ of the substrate W. FIG. 9(*a*) to FIG. 9(*d*) are diagrams representing a difference in the film thickness distribution (the size of fluctuation) when the rotation angle θ is differentiated. FIG. 9(*a*) shows a case in which the rotation angle θ=θ21, FIG. 9(*b*) shows a case in which the rotation angle θ=θ22, FIG. 9(*c*) shows a case in which the rotation angle θ=θ23, and FIG. 9(*d*) shows a case in which the rotation angle θ=θ24 (θ21<θ22<θ23<θ24). Specifically, the angle θ21=0°. The angles θ22 and θ23 are respectively and approximately correspond to the angles θ2 and θ3 shown in FIG. 6(*a*) to FIG. 6(*c*) (θ23>180°). The angle θ24 is sufficiently larger than the angle θ23 (θ24>>θ23). The rotation time of the substrate W is set to be constant. In other words, the diagram shows analysis results of the film thickness distribution when the rotation speed of the substrate W is differentiated.

When the rotation angle θ=θ21 (0°), the film thickness is larger in the vicinity of the point A and smaller in the vicinity of the point B than in the center of the substrate W. When the rotation angle θ=θ22, the film thickness is also larger in the vicinity of the point A and smaller in the vicinity of the point B than in the center of the substrate W. However, the film thickness in the vicinity of the point A is smaller and the film thickness in the vicinity of the point B is larger in a case in which the rotation angle θ=θ22 than in a case in which the rotation angle θ=0°. That is, it is known that when the rotation angle θ is set to be large, the fluctuation of the film thickness distribution is alleviated.

Furthermore, when the rotation angle θ is equal to or larger than θ23, the fluctuation of the film thickness distribution is hardly observed and a uniform plating film is formed. This principle is described.

As described in relation to FIGS. 2 and 3, the outer shape of the resistance region 18 has a wave shape which is periodic and annularly continuous. Therefore, while the substrate W and the resistor 8 relatively rotate by half of a periphery, the point Aac (the point Bac) passes through the outer side of the resistance region 18 by a plurality of periods having a wave shape. During this half-circumferential rotation, that is, until the rotation angle θ becomes 180°, the resistance region 18 and the shielding region 20 alternately face the peripheral edge portion of the plating region Ac each several times. Thus, when the rotation angle θ becomes equal to or larger than 180°, the fluctuation of the film thickness of the peripheral edge portion of the plating region Ac is alleviated.

After the rotation angle θ becomes equal to or larger than 180°, the growth of the plating film becomes uniform over the whole region of the plating region Ac. Thus, a difference in the fluctuation of the film thickness distribution is hardly generated when the rotation angle θ=θ23 and when the rotation angle θ=θ24.

Figure 10A:
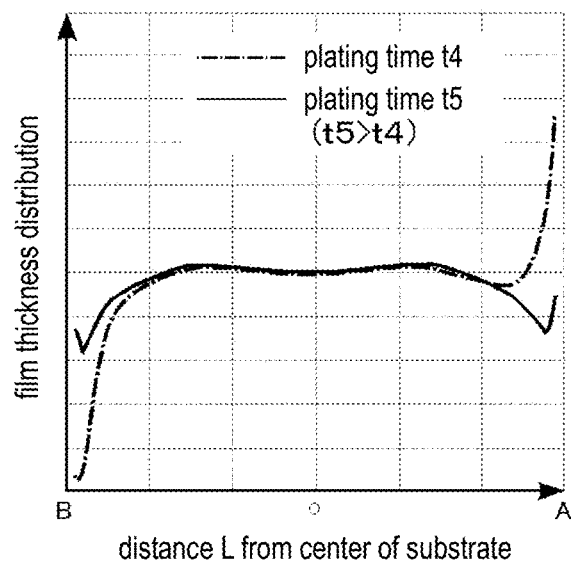
FIG. 10(a) to FIG. 10(c) are graphs showing a difference in the film thickness distribution due to an amplitude of a trochoid.
Figure 10B:
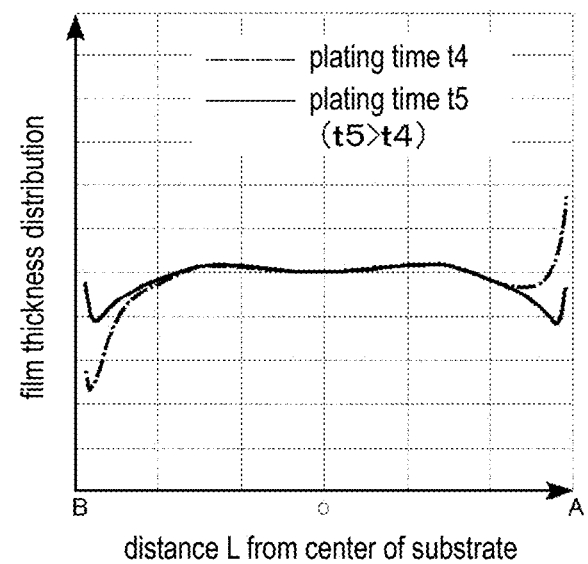
Figure 10C:
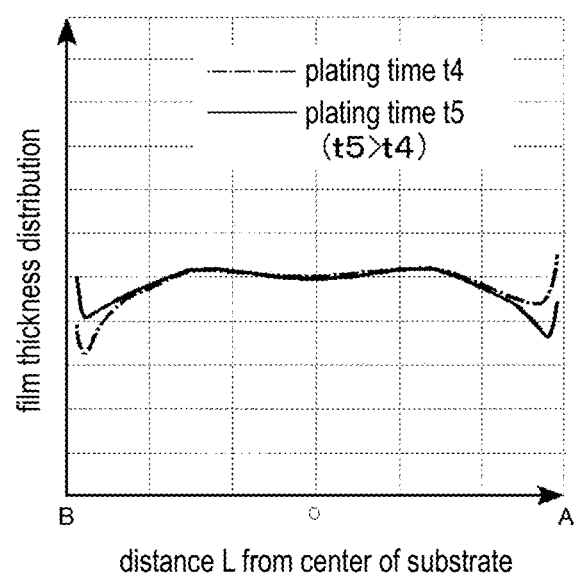

FIG. 10(a) to FIG. 10(c) are graphs showing a difference in the film thickness distribution due to an amplitude a of a trochoid. Hereinafter, the amplitude a in the embodiment is set to d [mm]. FIG. 10(a) shows a case of the epitrochoid having a radius Rt that satisfies Rstd−(d+1)≤Rt≤Rstd+(d+1) (see FIG. 3) as comparative example 3. FIG. 10(b) shows a case of the epitrochoid having a radius Rt that satisfies Rstd−d≤Rt≤Rstd+d as the embodiment. FIG. 10(c) shows a case of the epitrochoid having a radius Rt that satisfies Rstd−(d−0.5)≤Rt≤Rstd+(d−0.5) as comparative example 4.

That is, the radius Rstd of the reference circle 16 is all equal in FIGS. 10(a) to 10(c). Meanwhile, with regard to the amplitude a, the amplitude a=d+1 [mm] in comparative example 3, the amplitude a=d [mm] in the embodiment, and the amplitude a=d−0.5 [mm] in comparative example 4. In the diagrams, a dashed line shows a case of a plating time t4, a solid line shows a case of a plating time t5 (t5>t4). Besides, in the embodiment, comparative example 3, and comparative example 4, the number of apexes v of the epitrochoid is equal.

If the amplitude a is a proper value with respect to the radius Rstd of the reference circle 16 as shown in the embodiment (FIG. 10(b)), the fluctuation of the film thickness distribution can be reduced by sufficiently taking the plating time. Meanwhile, when the amplitude a is larger than the proper value as shown in comparative example 3, the fluctuation of the film thickness distribution will hardly become small even if the plating time is sufficiently taken. When the amplitude a is large, the shielding region 20 is excessively positioned on the radially inner side with respect to the plating region Ac. Therefore, not only the film thickness of the peripheral edge portion is suppressed in the plating region Ac, but also the film thickness on the radially inner side of the plating region Ac is suppressed, wherein the growth of the thickness of the plating film should be suppressed in the peripheral edge portion. Accordingly, the fluctuation of the film thickness distribution easily becomes large.

In addition, when the amplitude a is smaller than the proper value as shown in comparative example 4, the film thickness is small in the vicinity of the point A and the point B to which distances L from the center of the substrate are large (FIG. 10(c)). When the amplitude a is small, the shielding region 20 becomes small, and thus in the peripheral edge portion of the plating region Ac, the movement of the ion 24 from the anode 4 to the substrate W cannot be sufficiently restricted. Accordingly, the fluctuation of the film thickness distribution becomes large. In other words, as the resistor 8 of the embodiment, the fluctuation of the film thickness distribution can be reduced by setting the outer shape of the resistance region 18 as an epitrochoidal shape having an appropriate amplitude a with respect to the reference circle 16. Thus, the in-plane uniformity of the plating film in the substrate W can be improved. Besides, the size of the reference circle 16 or the proper value of the amplitude a is different depending on various conditions such as the type of the plating liquid, the size of the plating region Ac, the potential difference between the anode 4 and the substrate W, or the like.

Based on FIGS. 1 to 3, the following description can be made when items in FIGS. 4 to 10 are summarized.

As described in relation to FIG. 4(a) to FIG. 4(b), the outer shape of the resistance region 18 is set as an epitrochoidal shape according to the embodiment. The structure of the resistor 8 is formed in this way, and thereby the film thickness difference between the center portion and the peripheral edge portion of the plating region Ac can be alleviated.

As described in relation to FIG. 5(a) to FIG. 5(b), according to the embodiment, when the number of apexes v of the outer shape of the resistance region 18 is 2(2n+1) (n is a natural number), the fluctuation of the thickness of the plating film (the fluctuation ratio of the film thickness) is small. When the number of apexes v meets this condition, as shown in FIG. 3, if one of two intersection points of the straight line Ln and the outer shape of the resistance region 18 is the apex M1, the other intersection point is the apex M2.

As described in relation to FIGS. 6 and 7, the structure of the resistor 8 of the embodiment is used, and the plating time is sufficiently ensured, and thereby the fluctuation of the film thickness distribution can be alleviated.

As described in relation to FIGS. 8 and 9, the structure of the resistor 8 of the embodiment is used, and the rotation speed is adjusted so that the relative rotation angle θ between the substrate W and the resistor 8 becomes equal to or larger than 180°, and thereby the fluctuation of the film thickness distribution can be alleviated.

Besides, when analysis results of FIGS. 6 to 9 are summarized, it can be said that the relative rotation angle θ between the substrate W and the resistor 8 is set to be sufficiently large (θ≥180°), and thereby the fluctuation of the film thickness distribution can be alleviated.

As described in relation to FIG. 10(a) to FIG. 10(c), according to the embodiment, the amplitude a having an appropriate size with respect to the reference circle 16 is set, and thereby the fluctuation of the film thickness distribution can be alleviated.

Figure 11A:
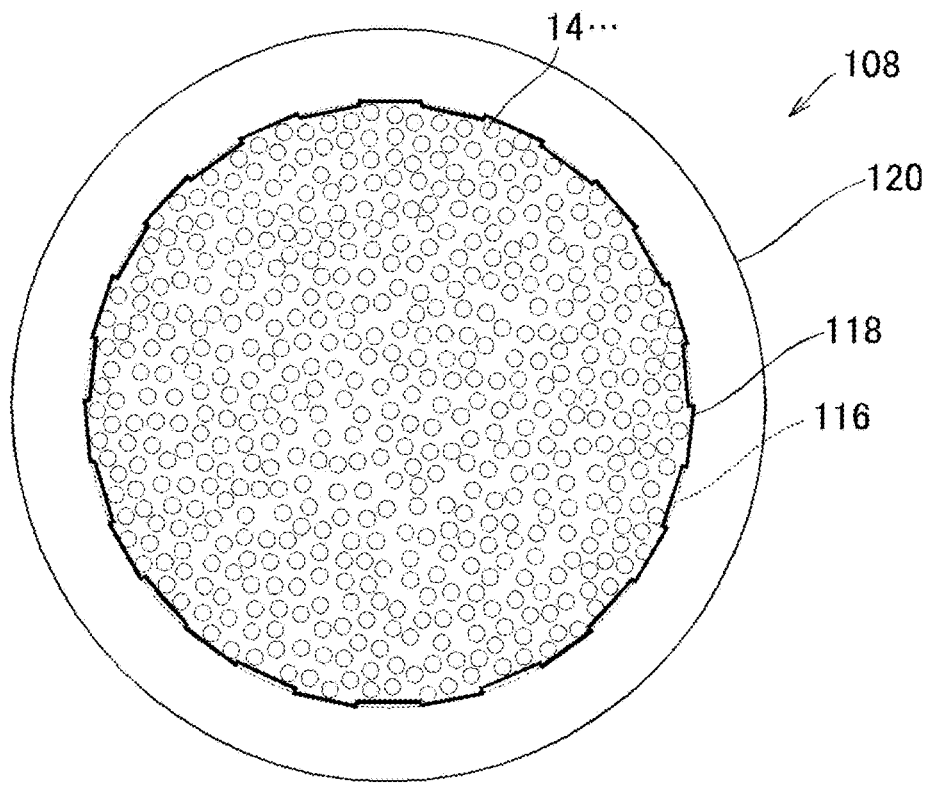
FIG. 11(a) to FIG. 11(b) are plane views showing a resistance region of a resistor according to a variation example.
Figure 11B:
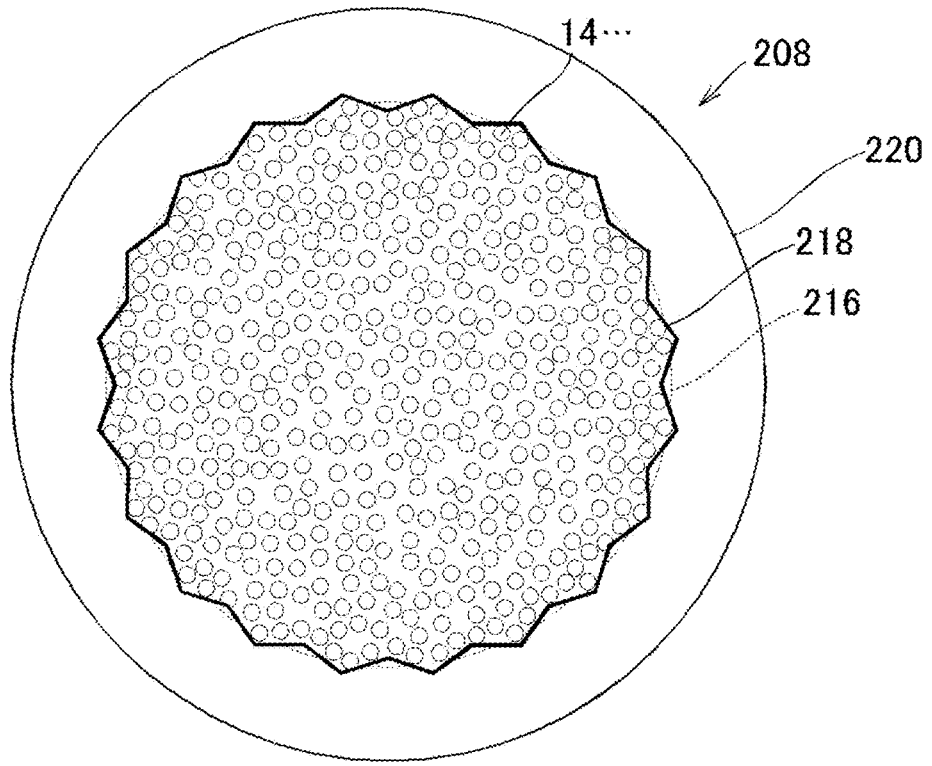

FIG. 11(a) to FIG. 11(b) are plane views showing a resistor according to a variation example. FIG. 11(a) shows a resistor of variation example 1, and FIG. 11(b) shows a resistor of variation example 2.

With regard to a resistor 108 of variation example 1, the shape of a resistance region 118 is different from the shape of the resistance region of the resistor 8 of the embodiment. The resistor 108 has the resistance region 118 on the radially inner side of a shielding region 120. With regard to the resistor 108, an outer shape of the resistance region 118 is a rectangular wave shape with respect to a reference circle 116. That is, the outer shape of the resistance region 118 has a shape which is periodic and annularly continuous with respect to the reference circle 116, and from which a radial distance to the reference circle 116 changes discontinuously along a peripheral direction.

In the resistor 108, the shielding region 120 and the resistance region 118 also alternately face the outer periphery portion of the plating region Ac (see FIG. 1). Thus, the in-plane uniformity of the plating film in the plating region Ac is improved. Meanwhile, with regard to the resistor 8 of the embodiment, a distance between the point A (or the point B) and the peripheral edge portion of the resistance region 18 continuously changes when the substrate W and the resistor are relatively rotated. The resistor 8 can gently change the shielding of the potential with respect to the peripheral edge portion of the plating region Ac, and thus the fluctuation of the film thickness distribution of the plating film can be further suppressed.

With regard to a resistor 208 of variation example 2, the shape of a resistance region 218 is different from the shape of the resistance region of the resistor 8 of the embodiment. The resistor 208 has the resistance region 218 on the radially inner side of a shielding region 220. An outer shape of the resistance region 218 is a triangular wave shape with respect to a reference circle 216. That is, the outer shape of the resistance region 218 has a shape which is periodic and annularly continuous with respect to the reference circle 216, and from which a radial distance to the reference circle 216 continuously changes along a peripheral direction.

In the resistor 208, the shielding region 220 and the resistance region 218 also alternately face the outer periphery portion of the plating region Ac (see FIG. 1). Thus, the in-plane uniformity of the plating film in the plating region Ac is improved.

Figure 12:
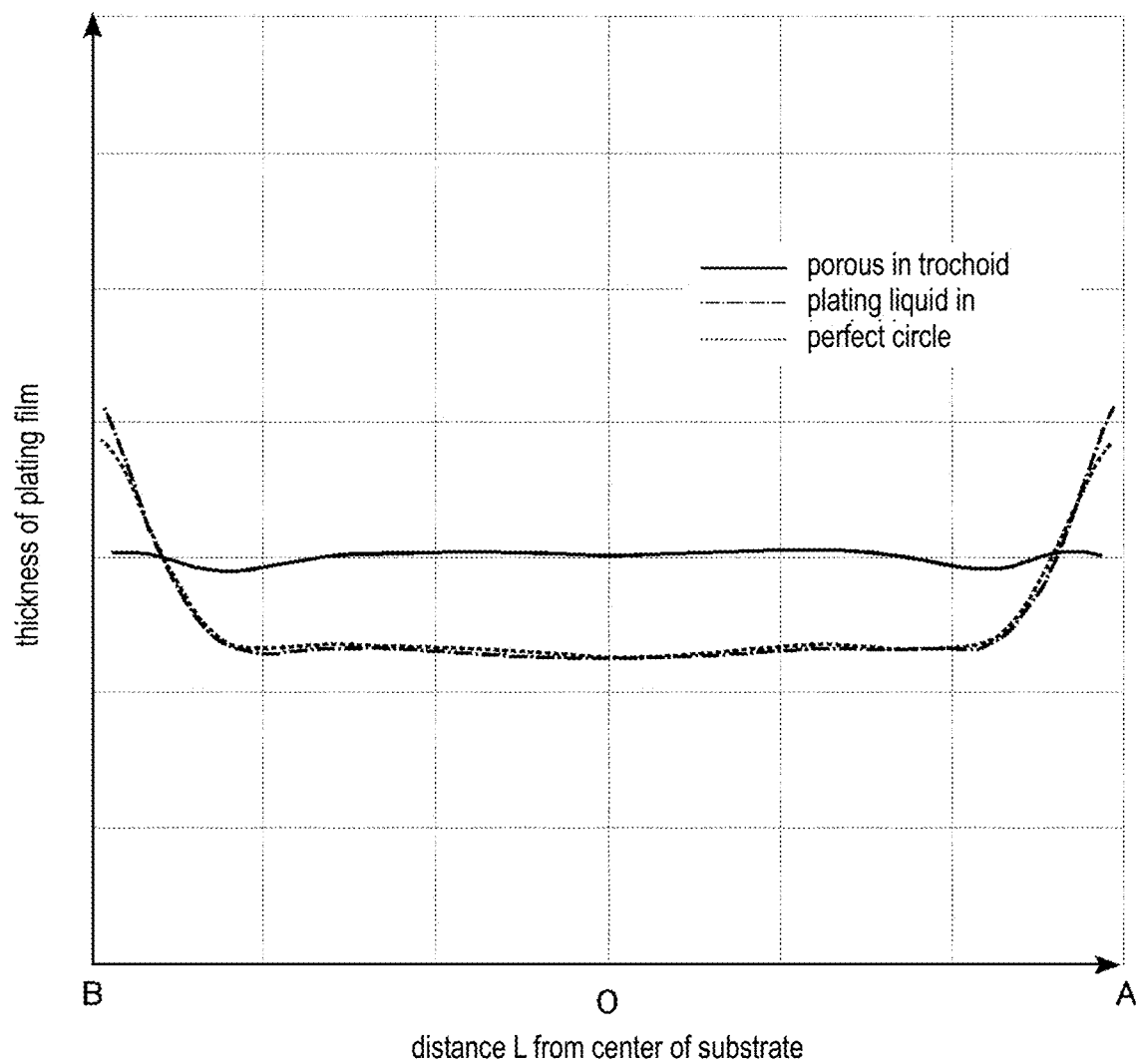
FIG. 12 is a graph showing a difference in the thickness of the plating film with respect to a shape of the resistor.

FIG. 12 is a graph showing a difference in the thickness of the plating film of the substrate W when the resistor of the embodiment and shielding bodies (insulators) of comparative examples are respectively used. A vertical axis shows the thickness of the plating film, and a horizontal axis shows a distance from a center in the plating region Ac. A solid line shows a case in which the resistor 8 is used as the embodiment. A dotted line shows a case in which a shielding body, that is a frame body having no resistance region and has a perfect circular inner shape, is used as comparative example 5. A dashed line shows a case in which a shielding body, that is a frame body having no resistance region and has an epitrochoidal inner shape, is used as comparative example 6. The shielding body of comparative example 5 and the shielding body of comparative example 6 both consist of insulators, and shield the movement of the ion 24 in a frame-like portion.

In the shielding body of comparative example 5 or the shielding body of comparative example 6, the plating film is thin in the center portion of the plating region Ac, and the plating film is thick in the peripheral edge portion. That is, it is known that when the shielding body having an annular shape (comparative example 5) or the shielding body having an epitrochoidal inner shape (comparative example 6) is used, a uniform plating film cannot be obtained in the plating region Ac.

Meanwhile, with regard to the resistor of the embodiment, the thickness of the plating film is approximately constant from the center of the plating region Ac to the peripheral edge portion. As described in relation to FIG. 4(a) to FIG. 4(b), with regard to the resistor of the embodiment, the resistance region 18 and the shielding region 20 alternately face the peripheral edge portion of the plating region Ac. Thereby, the film thickness difference between the center portion and the peripheral edge portion of the plating region Ac is alleviated, and the in-plane uniformity is improved.

An embodiment of the disclosure is described above, but the disclosure is not limited to the specific embodiment, and various changes may certainly be made in the scope of technical ideas of the disclosure.

In the embodiment described above, a punching plate is used as the resistor. The material of the punching plate is not described, but no matter the material is an inorganic material or an organic material, various materials can be selected as long as the materials have resistance against the plating liquid and are processable.

In addition, as a variation example of the resistor, a resistor in which the resistance region is a porous body may be used.

As the porous body, a porous body can be selected which has a hole diameter on the order of nanometer to micrometer and is configured by a clathrate compound. For example, a mesoporous material of $SiO_2$, SiC, $Al_2O_3$, Nb, Ta, Ti or the like, or a layered inorganic compound may be used.

In the embodiment described above, the outer shape of the resistance region is described as an epitrochoidal shape. In addition, in variation examples 1 and 2, the outer shape of the resistance region is described as a rectangular wave shape or a triangular wave shape with respect to the reference circle. The outer shape of the resistance region is not limited to the shapes of the embodiment, and may be a wave shape which is periodic and annularly continuous in the variation examples or the like.

In the embodiment described above, the rotation of the substrate is described as an example of the relative rotation between the substrate and the resistor. In the variation examples, the substrate may be fixed and the resistor may be rotated.

Besides, the disclosure is not limited to the above embodiment or the variation examples, constituent elements can be changed and embodied without departing from the scope of the disclosure. Various inventions may be formed by appropriately combining the plurality of constituent elements disclosed in the above embodiment and the variation examples. In addition, several constituent elements may be deleted from all of the constituent elements shown in the above embodiment and the variation examples.

According to the disclosure, excellent in-plane uniformity of a plating film can be maintained regardless of a distance between a resistor and a substrate.

What is claimed is:

1. A plating device for performing a plating treatment on a substrate having a circular plating region, comprising:
a plating tank;
an anode which is disposed in the plating tank;
a substrate holder which holds the substrate and is disposed in a way of facing the anode in the plating tank;
a substrate contact which comes into contact with a peripheral edge portion of the substrate and supplies a current to the substrate;
a resistor which is disposed in a way of facing the substrate holder between the anode and the substrate holder in the plating tank, and is used for adjusting ion movement between the anode and the substrate; and
a rotation driving mechanism which causes the resistor and the substrate holder to relatively rotate around an axis line, wherein
the resistor comprises:
a shielding region which forms an outer frame and shields the ion movement between the anode and the substrate; and
a resistance region which is formed on the radially inner side of the shielding region, and has a porous structure allowing the passage of an ion, and
an outer shape of the resistance region has an amplitude centering on an imaginary reference circle, and has a wave shape which is periodic and annularly continuous,
wherein the number of apexes of the wave shape is 2(2n+1), and n is a natural number, and
when a first apex which is one of a plurality of apexes forming the wave shape is on an imaginary line in a diameter direction that passes through a center of the imaginary reference circle, a second apex which is another one of the plurality of apexes is positioned on the imaginary line, and when the first apex is positioned on the outer side of the imaginary reference circle, the second apex is positioned on the inner side of the imaginary reference circle.

2. The plating device according to claim 1, wherein the outer shape of the resistance region has a shape in which a radial distance to the imaginary reference circle continuously changes along a peripheral direction.

3. The plating device according to claim 1, wherein the outer shape of the resistance region has a curved shape.

4. The plating device according to claim 3, wherein the outer shape of the resistance region has a trochoidal shape.

5. The plating device according to claim 1, wherein a radius of the imaginary reference circle is smaller than a radius of an outer shape of the plating region in the substrate.

6. The plating device according to claim 1, wherein the first apex has a radius to be equal to a radius of the plating region.

7. A resistor, which is attached to a plating tank of a plating device and is used for adjusting ion movement between an anode and a substrate, comprising:

a shielding region which forms an outer frame of the resistor and shields an ion; and a resistance region which is formed on the radially inner side of the shielding region, and has a porous structure allowing the passage of the ion, wherein an outer shape of the resistance region has an amplitude centering on an imaginary reference circle, and has a wave shape which is periodic and annularly continuous, wherein the number of apexes of the wave shape is $2(2n+1)$, and n is a natural number, and when a first apex which is one of a plurality of apexes forming the wave shape is on an imaginary line in a diameter direction that passes through a center of the imaginary reference circle, a second apex which is another one of the plurality of apexes is positioned on the imaginary line, and when the first apex is positioned on the outer side of the imaginary reference circle, the second apex is positioned on the inner side of the imaginary reference circle.

8. The resistor according to claim 7, wherein the first apex has a radius to be equal to a radius of the plating region.

* * * * *